United States Patent [19]
Harafuji et al.

[11] Patent Number: 5,345,145
[45] Date of Patent: Sep. 6, 1994

[54] METHOD AND APPARATUS FOR GENERATING HIGHLY DENSE UNIFORM PLASMA IN A HIGH FREQUENCY ELECTRIC FIELD

[75] Inventors: Kenji Harafuji; Mitsuhiro Ohkuni; Tokuhiko Tamaki; Masafumi Kubota, all of Osaka; Noboru Nomura, Kyoto, all of Japan

[73] Assignee: Matsushita Electric Industrial Co., Ltd., Osaka, Japan

[21] Appl. No.: 39,911

[22] Filed: Mar. 30, 1993

[30] Foreign Application Priority Data

Mar. 31, 1992 [JP] Japan .................. 4-077785

[51] Int. Cl.⁵ .............................. H01J 7/24
[52] U.S. Cl. .................. 315/111.41; 315/111.21; 315/111.71; 315/111.81; 118/723 R
[58] Field of Search .............. 315/111.41, 111.21, 315/111.71, 111.81; 118/723

[56] References Cited

U.S. PATENT DOCUMENTS

| | | | |
|---|---|---|---|
| 3,442,758 | 5/1969 | Penfold et al. | 176/1 |
| 3,523,206 | 8/1970 | Drabier et al. | 313/161 |
| 4,572,759 | 2/1986 | Benzing | 156/345 |
| 4,585,668 | 4/1986 | Asmussen | 427/38 |
| 4,589,123 | 5/1986 | Pearlman et al. | 315/111.71 X |
| 4,630,566 | 12/1986 | Asmussen et al. | 315/111.81 X |
| 4,792,732 | 12/1988 | O'loughlin | 315/334 |
| 4,859,908 | 8/1989 | Yoshida et al. | 315/111.81 |
| 5,038,713 | 8/1991 | Kawakami et al. | 118/723 |

FOREIGN PATENT DOCUMENTS

| | | |
|---|---|---|
| 0285668 | 10/1988 | European Pat. Off. . |
| 59-139627 | 8/1984 | Japan . |
| 59-232420 | 12/1984 | Japan . |
| 3-30424 | 2/1991 | Japan . |
| WO06922 | 11/1986 | PCT Int'l Appl. . |

*Primary Examiner*—Robert J. Pascal
*Assistant Examiner*—Reginald A. Ratliff
*Attorney, Agent, or Firm*—Willian Brinks Hofer Gilson & Lione

[57] ABSTRACT

A plasma generating method comprises: a first step of disposing a plurality of lateral electrodes at lateral sides of a plasma generating part in a vacuum chamber; a second step of respectively applying, to the lateral electrodes, high frequency electric powers of which frequencies are the same as one another and of which phases are different from one another, thereby to excite, in the plasma generating part, a high frequency rotating electric field to cause electrons under translational motions in the plasma generating part to present oscillating or rotating motions; and a third step of applying, to the plasma generating part, a magnetic field substantially at a right angle to the working plane of the high frequency rotating electric field, thereby to convert the translational movement of the electrons in the plasma generating part into revolving motions under oscillating or rotating motions by which the electrons revolve in the plasma generating part. The high frequency rotating electric field and the magnetic field cause the electrons in the plasma generating part to be confined therein.

22 Claims, 20 Drawing Sheets

+10 G

+5 G

−5 G

-10G

-20G 6.6 V/cm 3.3 V/cm

20MHz

10MHz

Along the X direction on the sample stage
(Distribution of magnetic field intensity
immediately above the sample stand)

Along the X direction on the sample stage

Fig.15

|  | Conventional Etching | | | Etching of the present invention |
|---|---|---|---|---|
|  | Parallel Plate RIE | Magnetron RIE | ECR etching |  |
| Anisotropy | △ | ○ | ○ | ○ |
| Uniformity | ○ | △ | △ | ○ |
| Damage | △ | △ | ○ | ○ |
| Selectivity | △ | ○ | ○ | ○ |
| Etching rate | △ | ○ | △ | ○ |
| Applicability to greater diameter | ○ | △ | △ | ○ |

$B(G) = 10 + 10\cos(\omega_E t)$
$f = \omega_E / 2\pi = 10 (MHz)$ $B(G) = -10 + 10\cos(\omega_E t)$
$f = \omega_E/2\pi = 10 \text{ MHz}$

METHOD AND APPARATUS FOR GENERATING HIGHLY DENSE UNIFORM PLASMA IN A HIGH FREQUENCY ELECTRIC FIELD

BACKGROUND OF THE INVENTION

The present invention relates to a plasma generating method and a plasma generating apparatus using the same.

A plasma generating method using high frequency electric discharge is used in the fields of dry-etching apparatus for microfabrication, plasma CVD apparatus or sputtering apparatus for forming thin films, ion implantation apparatus and the like. In such a plasma generating method, it is required to generate a plasma under a high vacuum in order to miniaturize the feature sizes or to control the film quality with high precision.

The following will discuss a dry etching method for microfabrication as an example of application of the plasma generating method.

The recent progress in the field of highly dense semiconductor integrated circuits is bringing about great changes equivalent to those brought by the Industrial Revolution. The highly dense arrangement of a semiconductor integrated circuit has been achieved by miniaturization of element dimensions, improvements in devices, provision of large-area chips and the like. Element dimensions are now miniaturized to the extent of the wavelength of light. In lithography, the use of laser or soft X-ray is taken into consideration. To realize micro-patterns, dry etching plays an important role as lithography does.

Dry etching is a process technology for removing unnecessary parts of a thin film or a substrate with the use of chemical or physical reactions on the surface of a gas-solid phase of radicals, ions or the like present in a plasma. As dry etching, there is most widely used a reactive ion etching (RIE), according to which a sample is exposed to a high-frequency discharge plasma of a suitable gas, so that an etching reaction is generated on the sample surface to remove unnecessary parts thereof. Generally, the necessary parts or parts not to be removed of the sample surface, are to be protected by a photo-resist pattern serving as a mask.

For miniaturization, it is required to properly arrange ions in direction. In this connection, it is important to reduce ion scattering in the plasma. To properly arrange the ions in direction, it is effective to increase the degree of vacuum in a plasma generating apparatus to increase the mean free path of the ions. However, when the degree of vacuum in the plasma chamber is increased, this presents the problem that high frequency discharge hardly occurs.

In view of the foregoing, there has been developed a method of applying a magnetic field to a plasma chamber to facilitate discharge, e.g., a magnetron reactive ion etching technology, an electron cyclotron resonance etching technology (ECR), or the like.

FIG. 21 is a schematic diagram of a reactive ion etching apparatus using conventional magnetron discharge. Reactive gas is introduced into a metallic chamber 81 through a gas controller 82. The pressure in the chamber 81 is controlled to a suitable value by an exhaust system 83. An anode 84 is disposed at an upper part of the chamber 81, and a sample stage 85 serving as a cathode is disposed at a lower part of the chamber 81. An RF power supply 87 is connected to the sample stage 85 through an impedance matching circuit 86, so that high frequency discharge takes place between the sample stage 85 and the anode 84.

Disposed at the lateral sides of the chamber 81 are two pairs of AC electromagnets 88 of which phases are shifted by 90°, the AC electromagnets 88 of each pair being opposite to each other. By the two pairs of AC electromagnets 88, a rotational magnetic field is applied into the chamber 81 to facilitate discharge under a high vacuum. With such an arrangement, the rotational magnetic field causes electrons to present cycloid motions. This lengthens the motional passages of the electrons to increase the efficiency of ionization.

According to the magnetron technology or ECR technology above-mentioned, however, the plasma is nonuniform in density. This not only makes fine etching difficult, but also gives damages to a sample or workpiece.

In a conventional magnetron reactive ion etching apparatus, the rotational magnetic field averages the local nonuniformity of a plasma with the passage of time, causing the plasma nonuniformity to be equalized. However, since the momentary densities of plasma are not uniform, potentials locally differ from one another. Accordingly, when the conventional magnetron reactive ion etching apparatus is applied to a MOSLSI process, there is a possibility of a gate oxide layer being broken.

In an ECR etching apparatus, too, since the magnetic field is distributed in the radial direction of the chamber, the plasma densities are locally coarse and dense. This causes the etching source to be nonuniform or produces local differences in potential. Due to the nonuniformity of the plasma, the uniformity of etching is deteriorated, thus making it difficult to produce LSIs with high yield. When the plasma is not uniform, it means that accurate etching cannot be made when dry-etching large-diameter wafers or hyperfine pattern LSIs in which thinner gate oxide layers are used.

Also, there has been proposed a method by which high frequency electric power of 100 to 200 MHz is superposed on a conventional magnetron etching apparatus of the parallel flat-plate type to be excited with 13.56 MHz, causing the plasma to be increased in density so that the self-bias voltage is decreased to reduce damages to a sample by high-energy ions.

According to this method, the plasma density can be increased, but it is difficult to improve the uniformity of the plasma. Thus, the problems due to nonuniformity of the plasma above-mentioned cannot be fully solved.

In view of the foregoing, the present invention is proposed with the object of generating a highly dense plasma excellent in uniformity under a high vacuum.

SUMMARY OF THE INVENTION

To achieve the object above-mentioned, the present invention is arranged such that a high frequency rotating electric field is excited in a plasma generating zone, thereby to cause electrons under translational motions in the plasma generating zone to present oscillating or rotating motions, and that a magnetic field is applied to the plasma generating zone, thereby to convert the translational movement of the electrons under oscillating or rotating motions into revolving movement by which the electrons revolve in the plasma generating zone, whereby the resulting synergistic effect causes the electrons in the plasma generating zone to be confined therein.

A first plasma generating method according to the present invention comprises; a first step of disposing a plurality of lateral electrodes at lateral sides of a plasma generating part in a vacuum chamber; a second step of respectively applying, to the lateral electrodes, high frequency electric powers of which frequencies are the same as one another and of which phases are different from one another, thereby to excite, in the plasma generating part, a high frequency rotating electric field to cause electrons under translational motions in the plasma generating part to present oscillating or rotating motions (with translational movement component); and a third step of applying, to the plasma generating part, a magnetic field substantially at a right angle to the working plane of the high frequency rotating electric field, thereby to convert the translational movement of the electrons under oscillating or rotating motions in the plasma generating part into revolving movement by which the electrons revolve in the plasma generating part, whereby the electrons in the plasma generating part are confined therein.

A second plasma generating method according to the present invention comprises: a first step of disposing a plurality of lateral electrodes at lateral sides of a plasma generating part in a vacuum chamber; a second step of respectively applying, to the lateral electrodes, high frequency electric powers of which frequencies are the same as one another and of which phases are different from one another, thereby to excite, in the plasma generating part, a high frequency rotating electric field to cause electrons under translational motions in the plasma generating part to present oscillating or rotating motions; and a third step of applying, to the plasma generating part, a magnetic field substantially at a right angle to the working plane of the high frequency rotational electric field, thereby to convert the translational movement of the electrons under oscillating or rotating motions in the plasma generating part into revolving movement by which the electrons revolve in the plasma generating part in a direction identical with or reverse to the direction of the rotational motions, whereby the electrons in the plasma generating part are confined therein.

According to each of the first and second plasma generating method, the high frequency electric powers at the second step are preferably greater than 1 MHz, and the absolute value of the intensity of the magnetic field at the third step is preferably greater than 2 G. Further, the following relationship is preferably established among the frequency f (MHz) of the high frequency electric powers at the second step, the intensity E (V/cm) of the rotational electric field excited by the high frequency electric powers and the absolute value B (G) of the intensity of the magnetic field at the third step:

$$1 < E/Bf < 50$$

Preferably, provision is made such that the intensity of the magnetic field at the third step is greater at the periphery of the plasma generating part than at the center thereof.

A first plasma generating apparatus according to the present invention comprises; a plurality of lateral electrodes disposed at lateral sides of a plasma generating part in a vacuum chamber; high frequency electric power applying means for respectively applying, to the lateral electrodes, high frequency electric powers of which frequencies are the same as one another and of which phases are different from one another, thereby to excite, in the plasma generating part, a high frequency rotating electric field cause electrons under translational motions in the plasma generating part to present oscillating or rotating motions; and magnetic field applying means for applying a magnetic field substantially at a right angle to the working plane of the high frequency rotating electric field, thereby to convert the translational movement of the electrons under oscillating or rotating motions in the plasma generating part into revolving movement by which the electrons revolve in the plasma generating part such that the electrons in the plasma generating part are confined therein.

In a second plasma generating apparatus according to the present invention, the first plasma generating apparatus is applied to an etching apparatus and further comprises (i) a sample stage disposed at a lower part of the plasma generating part inside of the vacuum chamber and (ii) an opposite electrode disposed at an upper part of the plasma generating part inside of the vacuum chamber.

Each of the first and second plasma generating apparatus may be arranged such that the magnetic field applying means comprises (i) a pair of upper and lower coils disposed vertically opposite to each other and (ii) power supplies for respectively applying electric currents to the pair of coils. In such an arrangement, when the power supplies have means for applying, to the pair of coils, electric currents in the forward or reverse direction which are steady with the passage of time, the magnetic field applied to the plasma generating part can be a static magnetic field which is steady with the passage of time. On the other hand, when the power supplies have means for applying, to the pair of coils, electric currents which are unsteady with the passage of time, the magnetic field applied to the plasma generating part can be a static magnetic field which is unsteady with the passage of time.

The lateral electrodes and the magnetic field applying means may be disposed outside of the vacuum chamber.

Preferably, members made of quartz or ceramics are disposed between the plasma generating part and each of the lateral electrodes, and between the plasma generating part and the magnetic field applying means.

Preferably, the high frequency electric power applying means has phase locking means arranged such that the differences in phase among the high frequency electric powers respectively applied to the lateral electrodes are the same as one another. Preferably, there are respectively applied, to the lateral electrodes, high frequency electric powers which are supplied from the same power supply and of which phases are different from one another.

Preferably, the second plasma generating apparatus further comprises temperature control means for controlling the temperature of the sample stage such that a plasma Is irradiated to the sample stage, and a bias voltage is applied to the sample stage for irradiating a plasma to a sample to be placed on the sample stage.

Preferably, the wall of the vacuum chamber is made of a nonmagnetic material or is magnetically shielded.

When the electric field is excited in the plasma generating part by respectively applying, to the plurality of lateral electrodes, high frequency electric powers of which frequencies are the same as one another and of which phases are different from one another, this causes electrons under translational motions in the plasma generating part to present oscillating or rotating motions. Accordingly, the electrons present translational cycloid motions (like motions in each of which a Lissajous's figure is drawn) in which the centers of the oscillating or rotating motions advance.

When there is applied, to the plasma generating part, a magnetic field substantially at a right angle to the working plane of the electric field above-mentioned, the translational movement components of the electrons which present translational cycloid motions in the plasma generating part, are converted into revolving movement components which revolve in the plasma generating part. More specifically, the electrons in the plasma generating part are moved such that the centers of the oscillating or rotating motions generated by the electric field, travel on the loci of the revolving motions generated by the magnetic field. Accordingly, the electrons do not come out from the plasma generating part and present cycloid motions together with oscillating or rotating motions.

Therefore, the electrons in the plasma generating part remain confined therein, thus practically increasing the probability of collision between gas molecules introduced in the plasma generating part and the electrons remaining confined therein. This increases the efficiency of ionization. Accordingly, the lower limit of the frequency of the high frequency electric powers required for electric discharge can be set to a value lower than a conventional one.

Further, the motional loci of the electrons in the plasma generating part can be widely distributed therein from the center thereof to the periphery thereof, thus improving the plasma in spatial uniformity. Also, this sufficiently increases the maximum of oscillatory variations of the kinetic energy of the electrons that draw the loci above-mentioned, thus increasing the efficiency of ionization.

Further, the electric field and the magnetic field excited in the vacuum chamber are spatially uniform, thus further improving the plasma in uniformity. This enables the apparatus to be readily made in a large size. Further, the mechanism for generating a magnetic field may be simple.

Further, the orbits of electrons can be readily controlled by a weak magnetic field requiring low power consumption. Accordingly, a higher efficiency of ionization under a high vacuum can be obtained and electric discharge can be facilitated as compared with a conventional plasma generating apparatus such as a dry etching apparatus of the parallel plate type. Accordingly, when the present invention is applied to a dry etching apparatus, a highly dense plasma can be obtained and ion scattering by gas molecules is reduced, thus assuring highly anisotropic etching. As compared with an etching apparatus using ECR discharge or magnetron discharge using a conventional magnetic field, the dry etching apparatus to which the present invention is applied, improves the plasma in uniformity in the plasma generating part in terms of space and time and hardly causes the plasma to be unevenly distributed. This minimizes damages to devices such as breakdown of gate oxide layers or the like.

DESCRIPTION OF THE DRAWINGS

FIG. 15 is a table in which the dry etching apparatus in FIG. 1 is compared with conventional dry etching apparatus;

DETAILED DESCRIPTION OF THE INVENTION

The following description will discuss a dry etching apparatus to which applied is the plasma genera ting method according to a first embodiment of the present invention.

Figure 1:
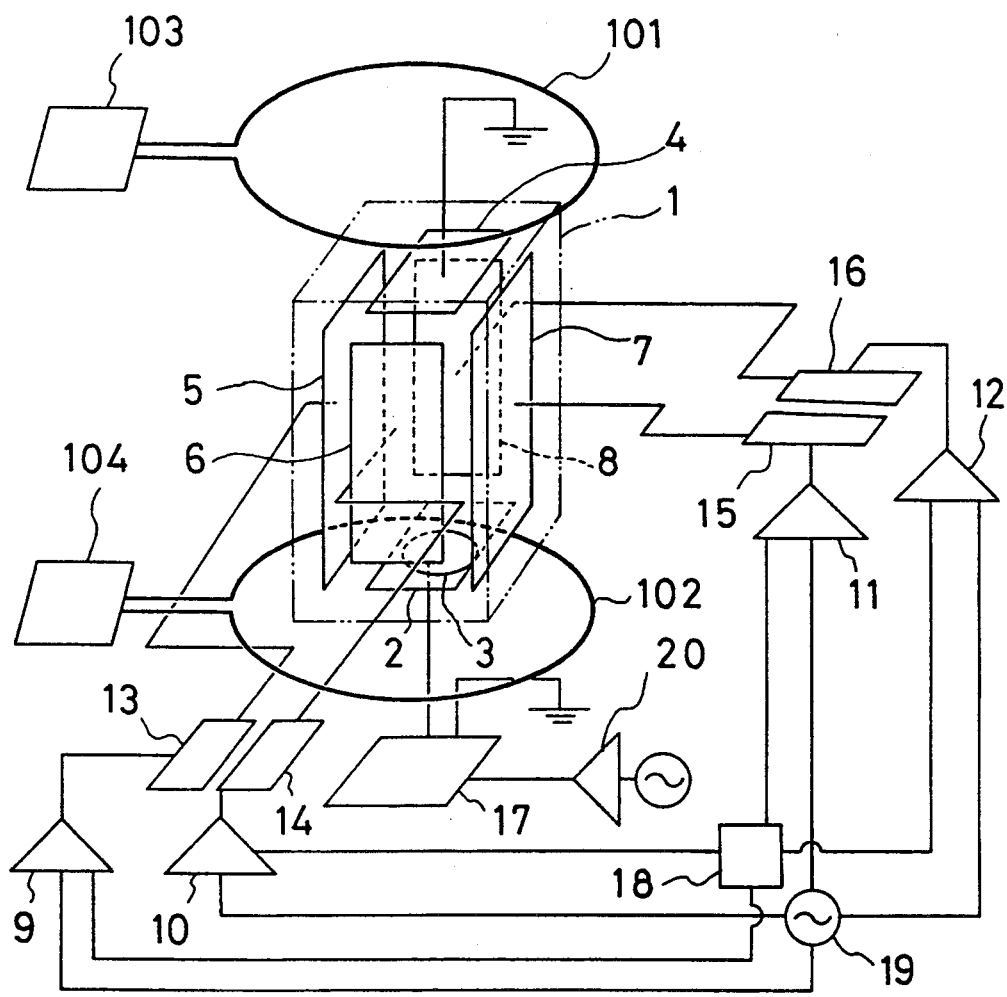
FIG. 1 is a schematic diagram showing the structure of a dry etching apparatus to which applied is a plasma generating method according to a first embodiment of the present invention.

FIG. 1 is a schematic diagram of the structure of the dry etching apparatus. In FIG. 1, disposed at a lower part of a rectangular parallelepiped chamber 1 is a sample stage 2 to which high frequency electric power of 13.56 MHz is to be applied. A sample to be etched 3 comprising a semiconductor wafer is placed on the sample stage 2. An opposite electrode 4 is disposed at an upper part of the chamber 1 and opposite to the sample stage 2. Disposed at the respective lateral sides of the chamber 1 are lateral electrodes 5, 6, 7, 8 to which high frequency electric powers of 10 MHz are to be applied. The respective phases of the electric powers respectively applied to the lateral electrodes 5, 6, 7, 8 are advanced or delayed by 90° in order of the reference numerals. The space defined by the sample stage 2, the opposite electrode 4 and the lateral electrodes 5, 6, 7, 8 is a plasma generating zone. A high frequency power supply 19 is adapted to supply high frequency electric powers to the lateral electrodes 5, 6, 7, 8 such that a rotational electric field having intensity of 3.3 V/cm is formed in this plasma generating zone.

In FIG. 1, there are disposed an upper circular coil 101 and a lower circular coil 102 which are respectively disposed at upper and lower parts of the chamber 1 and which are adapted to generate a magnetic field substantially at a right angle to the sample to be etched 3. DC power supplies 103, 104 are adapted to respectively apply electric currents to the upper circular coil 101 and the lower circular coil 102. The intensity of magnetic field B (G) is set in the range from 5 G to 10 G or from −20 G to −10 G.

Etching gas is introduced from an inlet port ( not shown) into the chamber 1 through a mass flow controller (not shown), and the pressure in the chamber 1 is controlled to about 0.1 Pa to about 10 Pa by a turbo pump (not shown).

The high frequency electric powers supplied from the high frequency power supply 19 are supplied to the lateral electrodes 5, 6, 7, 8 through amplifiers 9, 10, 11, 12 and matching circuits 13, 14, 15, 16. The high frequency electric powers supplied from the high frequency power supply 19 are controlled by phase locking means 18 such that the differences in phase among the electric powers respectively supplied to the lateral electrodes 5, 6, 7, 8 are constant (90°). To equalize the frequencies of the high frequency electric powers supplied to the lateral electrodes 5, 6, 7, 8, AC electric power supplied from the single high frequency power supply 19 is amplified by the amplifiers 9, 10, 11, 12.

After being amplified by an amplifier 20, high frequency electric power of 13.56 MHz is supplied to the sample stage 2 through a matching circuit 17.

The following description will discuss the operation of the dry etching apparatus having the arrangement above-mentioned.

Figure 2:
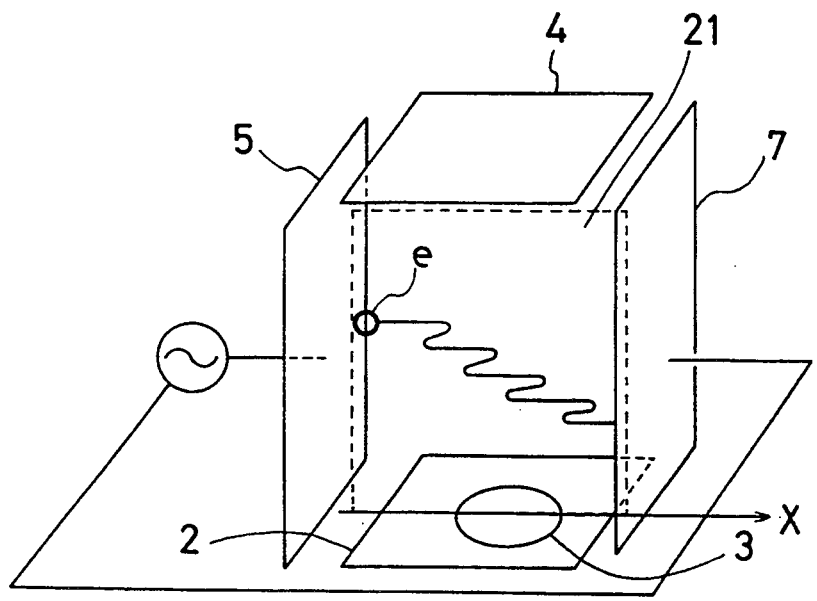
FIG. 2 is a schematic diagram showing the trajectory of an electron in a chamber of the dry etching apparatus shown in FIG. 1.

FIG. 2 schematically shows the trajectory of each of electrons e moved at the time when high frequency electric powers are applied, through a plasma generating part 21, to the lateral electrodes 5, 7 comprising a pair of opposite parallel flat-plate electrodes. While being subjected to oscillating motions by a high frequency electric field applied across the lateral electrodes 5, 7, the electrons e advance as arranged in the direction of the kinetic energy inherent therein.

Figure 5:
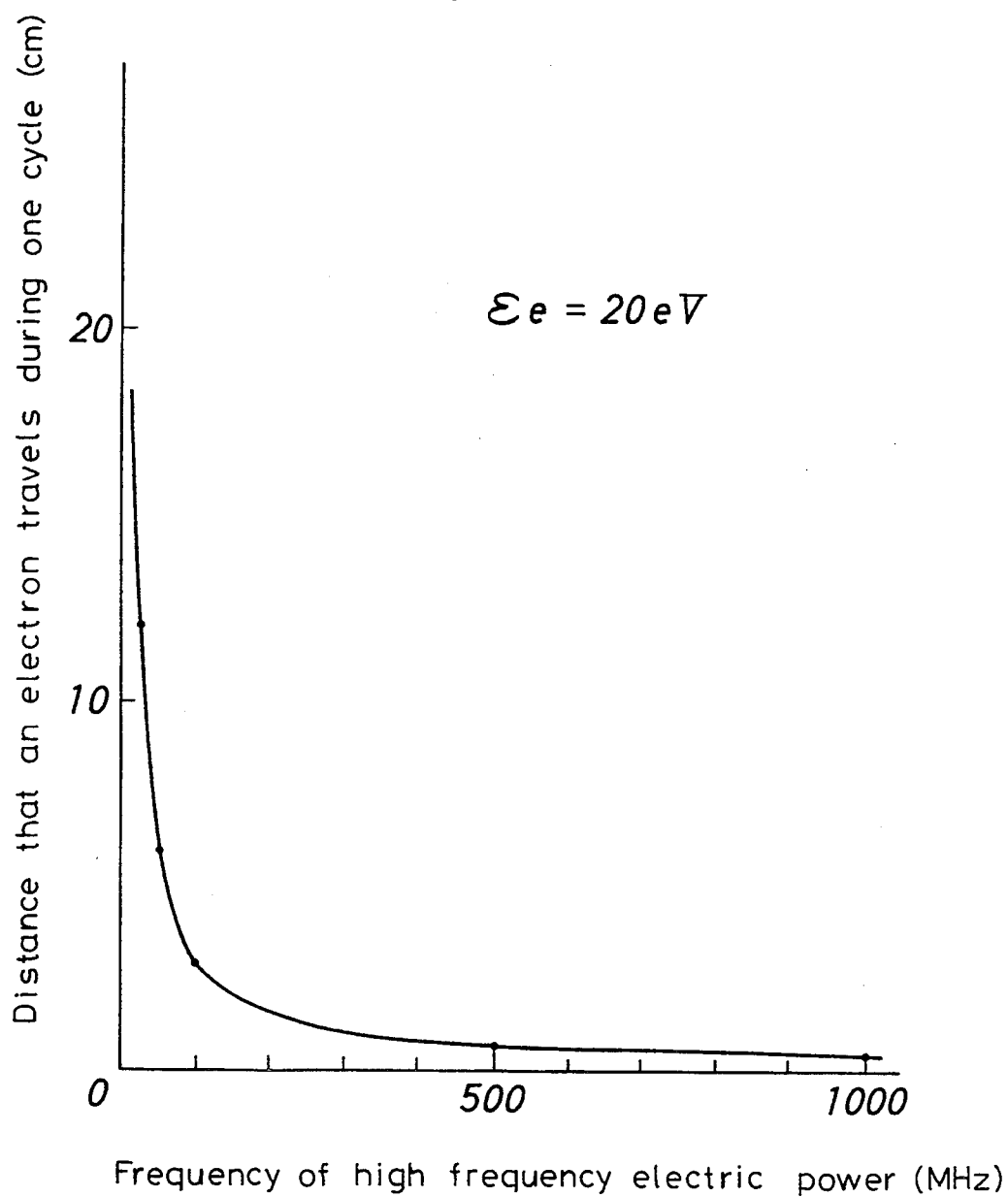
FIG. 5 is a characteristic view showing the relationship between the frequency of high frequency electric powers applied to lateral electrodes of the dry etching apparatus in FIG. 1 and the distance that an electron moves during one cycle of the high frequency electric powers above-mentioned.

FIG. 5 is a graph showing, in terms of the function of frequency, the distance that an electron e advances during one cycle of the high frequency electric powers. Here, an electron of 20 eV is considered. An electron e which travels in the X direction at an energy of 20 eV, moves about 6 cm during 20 nanoseconds which corresponds to one cycle of the high frequency electric powers of 50 MHz. When it is now supposed that the distance between the opposite lateral electrodes is equal to 30 cm, the electron e oscillates about five times while it travels this distance of 30 cm. When the energy of the electron e is great, the travelling speed is great to reduce the number of oscillations while the electron e travels the distance between the opposite lateral electrodes.

To ionize gas, an electron energy of not smaller than about 15 eV is generally required although it depends on the type of gas. Ionization takes place due to collision between the electrons e and gas molecules. Accordingly, as the travelling distances of the electrons e are longer, the probability of collision is increased to increase the efficiency of ionization. Since the distance between the opposite lateral electrodes is generally about douzens cm, high frequency electric powers of not less than about 50 MHz are required in order to improve the efficiency of ionization by oscillating the electrons e by the high frequency electric powers.

Conventionally, such high frequency electric powers have been hardly used for generating a plasma due to the difficulty of provision of a stable high-output power supply, the difficulty of impedance matching and the difficulty of the control of radiation. Only when a power supply of microwaves using a magnetron is available, high frequency electric power in the GHz band can be applied as discharge of microwaves.

Figure 3:
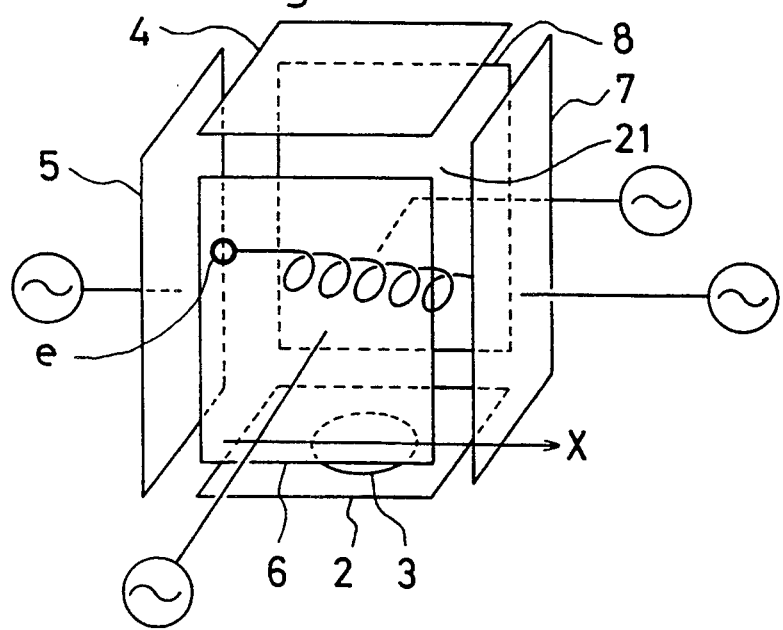
FIG. 3 is a schematic diagram showing the trajectory of an electron in the chamber of the dry etching apparatus shown in FIG. 1.

FIG. 3 is a view schematically showing the trajectory of each of electrons e moved at the time when high frequency electric powers of the same frequency are applied to the four lateral electrodes 5, 6, 7, 8 surrounding the plasma generating part 21 such that the respective phases of the electric powers respectively applied to the lateral electrodes 5, 6, 7, 8 are advanced or delayed by 90° in order of the reference numerals, thus generating a rotational electric field in the plasma generating part 21. Because of such an arrangement of the lateral electrodes 5, 6, 7, 8 and by the high frequency electric powers of which respective phases are successively shifted, a rotational electric field which is uniform in terms of time and space, is excited in the plasma generating part 21. Due to such a rotational electric field, each of the electrons e presents a cycloid motion in which a rotational motion is superposed on a translational motion which traverses the chamber 1. In this case, the rotational frequency of the rotational motion is con-trolled by the frequency of the electric field formed by the high frequency electric powers to be applied, while the radius of gyration of the rotational motion is controlled by the intensity of the electric field formed by the high frequency electric powers to be applied.

Figure 4:
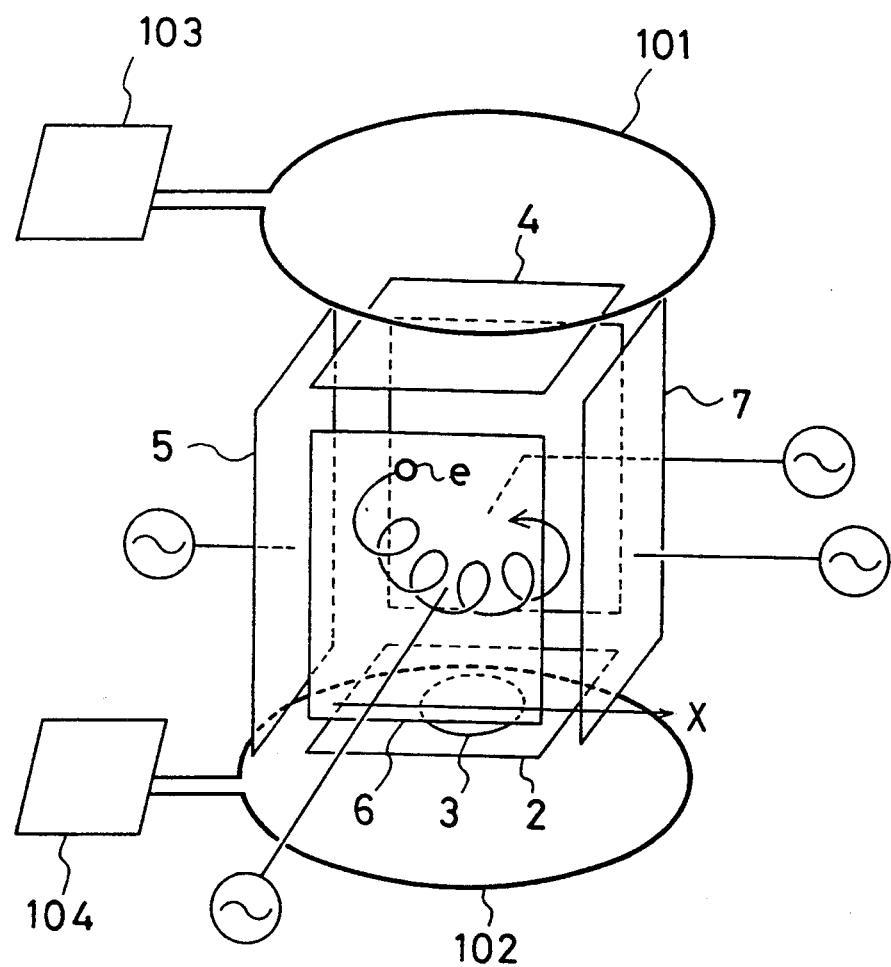
FIG. 4 is a schematic diagram showing the trajectory of an electron in the chamber of the dry etching apparatus shown in FIG. 1.

FIG. 4 shows the trajectory of each of electrons e moved at the time when a direct current is supplied to the upper and lower circular coils 101, 102 so that a magnetic field substantially at a right angle to the sample stage 2 is applied to the rotational electric field shown in FIG. 3. In such an arrangement, the translational motion of each of the electrons e travelling toward a lateral wall of the chamber 1 in the state shown in FIG. 3, is converted into a motion by which each of the electrons e revolves in the plasma generating part 21. The magnitude of such a revolving motion is proportional to the product of the magnitude of the electric field applied and the magnitude of the magnetic field applied. The direction of the revolving motion is at a right angle to both the electric and magnetic fields applied. As a result, each of the electrons e presents a motion in which a cyclotron revolving motion caused by the magnetic field is superposed on the rotational motion caused by the rotational electric field generated by the high frequency electric powers.

Figure 6:
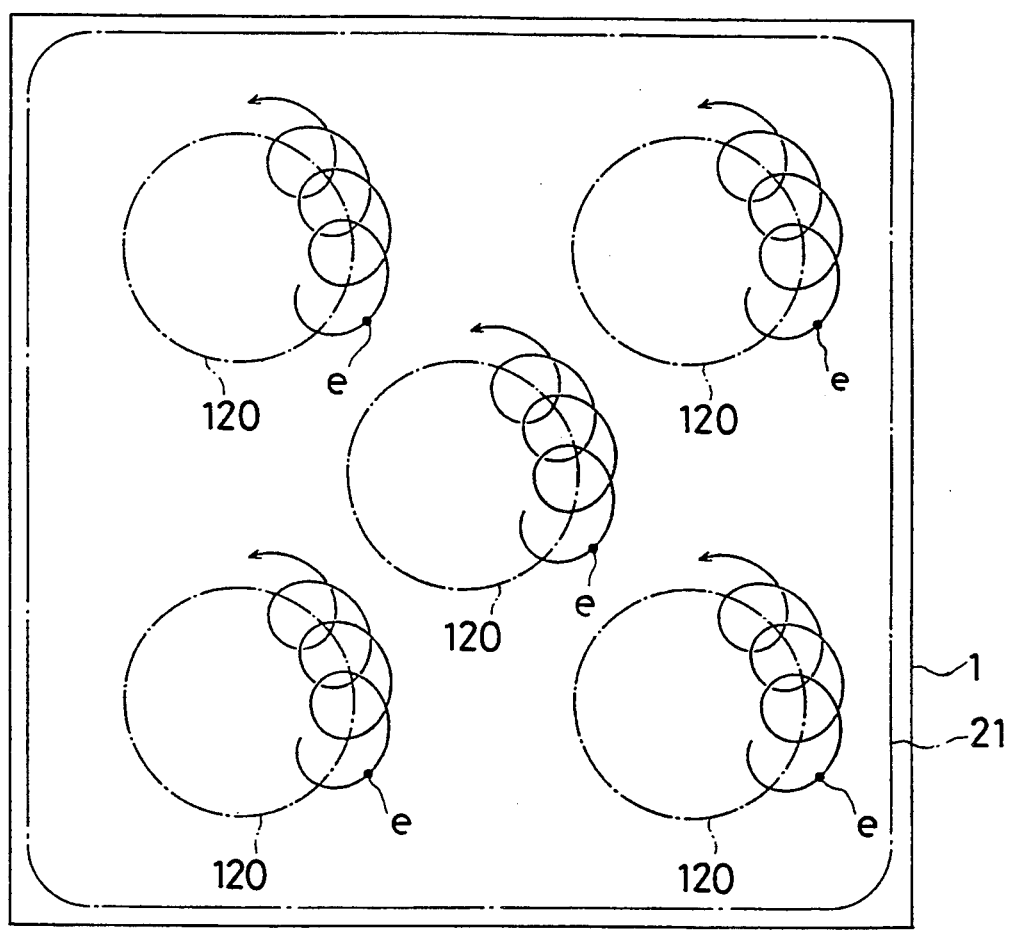
FIG. 6 is a schematic diagram of the loci of cycloid motions of electrons in the chamber of the dry etching apparatus shown in FIG. 1.
Figure 7A:
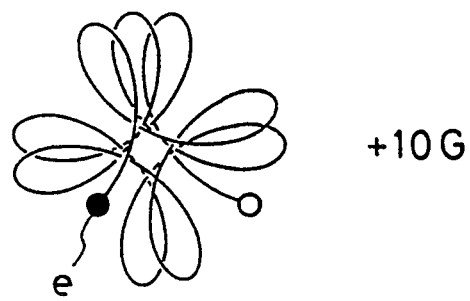
FIG. 7($a$) 7($c$) are is a schematic diagrams showing the dependency, on the direction and intensity of an applied magnetic field, of the cycloid motion of an electron in the chamber of the dry etching apparatus shown in FIG. 1.
Figure 7B:
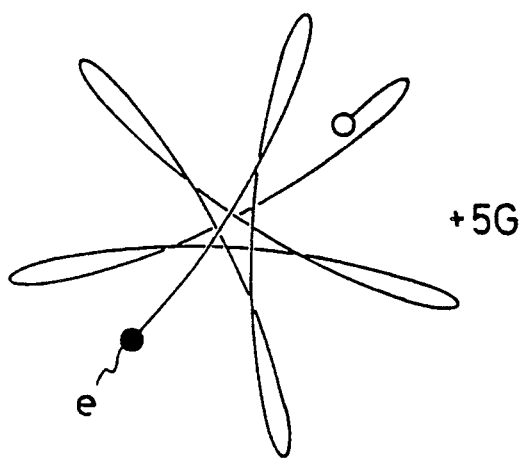
Figure 7C:
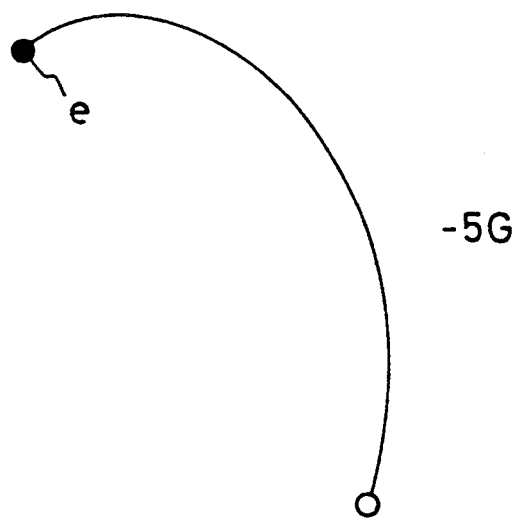
Figure 8A:
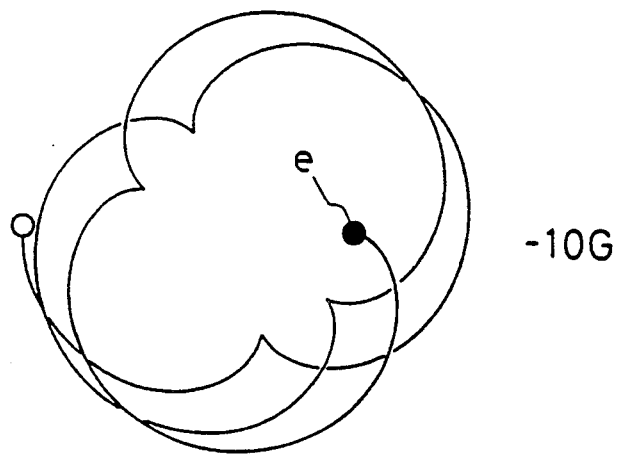
FIG. 8($a$) and ($b$) are schematic diagrams showing the dependency, on the direction and intensity of an applied magnetic field, of the cycloid motion of an electron in the chamber of the dry etching apparatus shown in FIG. 1.
Figure 8B:
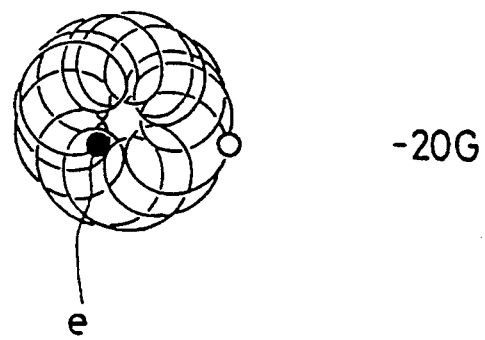

FIG. 6 is a schematic view of motions in each of which a cyclotron revolving motion is superposed on a rotational motion. Each electron e presents a revolving motion with the radius of cyclotron $r_c = mv/qB$ and rotational frequency $W_B = qB/m$ which is roughly determined by the intensity B of a magnetic field applied (wherein m is the mass of the electron, q is the electric charge of the electron, and v is the velocity of the electron in the direction at a right angle to the magnetic line of force ). Each electron e revolves on a circular orbit 120 of which radius is roughly determined by the frequency of the high frequency electric powers and the magnitude of the rotational electric field applied.

Generally, the area that each electron e moves in the plasma generating part 21 is broadened as the absolute value of the intensity of the applied magnetic field is smaller, as the intensity of the applied rotational electric field is stronger and as the frequency of the applied high frequency electric powers is lower.

Further, the area that each electron e moves in the plasma generating part 21 is narrower when the application direction of the magnetic field is set such that the revolving direction of the cyclotron motion is the same as the rotation direction of each electron e which presents a rotational motion caused by the rotational electric field generated by the high frequency electric powers (This rotation direction will be hereinafter referred to as the forward direction), than when the application direction of the magnetic field is set such that the revolving direction of the cyclotron motion is reverse to the rotation direction above-mentioned.

FIGS. 7(a)-(c) and 8(a)-(b) show the trajectory of each electron e at the time when an applied magnetic field is changed in magnitude and direction with the frequency of the high frequency electric powers being 10 MHz. When the intensity of the magnetic field is equal to −5 G, the rotational frequency of a rotational motion caused by the rotational electric field generated by the high frequency electric powers is substantially equal to the revolving frequency of a cyclotron revolving motion, and the rotating (revolving) directions are reverse to each other. That is, the electron e presents a motion in which a rotational motion and a revolving motion are cancelled by each other. In this case, the electron e comes outside of the plasma generating part 21 in a short period of time.

Figure 9A:
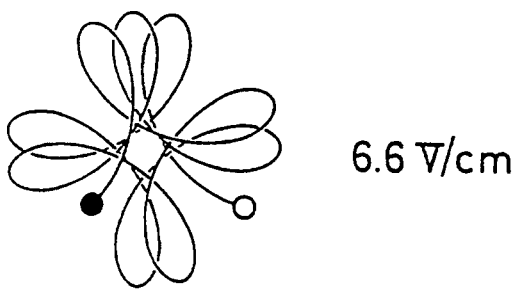
FIG. 9($a$) and ($b$) are schematic diagram showing the dependency, on the intensity of an applied electric field, of the cycloid motion of an electron in the chamber of the dry etching apparatus shown in FIG. 1.
Figure 9B:
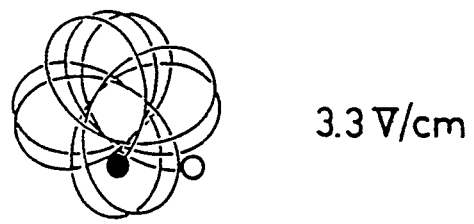
Figure 10A:
FIG. 10($a$) and ($b$) are schematic diagrams showing the dependency, on applied frequency, of the cycloid motion of an electron in the chamber of the dry etching apparatus shown in FIG. 1.
Figure 10B:
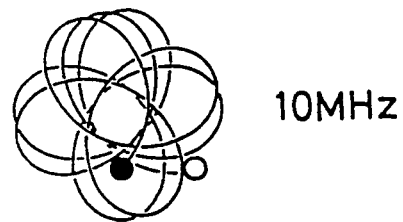

FIGS. 9(a)-(b) show the trajectory of each electron e at the time when an applied electric field is changed in magnitude with the frequency of the high frequency electric powers being 10 MHz. FIGS. 10(a0-b) show the motional passage of each electron e at the time when the high frequency electric powers are changed in frequency with the intensity of an applied magnetic field being set to 10 G and with the intensity of an applied rotational electric field being set to 3.3 V/cm.

In this embodiment, when a magnetic field and an electric field are applied to the plasma generating part 21 to cause each of the electrons e in the plasma generating part 21 to present a revolving motion combined with an oscillating motion or a rotational motion, most of the electrons e in the plasma generating part 21 can be confined therein. Accordingly, the travelling distances of the electrons e can be lengthened. This increases the density of the electrons e in the plasma generating part 21 to increase the efficiency of ionization.

When an electric field is applied to the plasma generating part 21 to cause each of the electrons e to present an oscillating motion or a rotational motion, it can be said that the cross-section of collision between electrons and gas molecules is substantially increased. Further, since the loci of rotational motion of the electrons e can be made spatially substantially uniform as shown in FIG. 6, the plasma can be further improved in uniformity.

According to the plasma generating method of the present invention, the efficiency of ionization is improved and a highly uniform plasma can be obtained. Accordingly, when the plasma generating method of the present invention is applied to an etching apparatus, such an etching apparatus can be improved in workability of microfabrication and causes less damages to devices.

Figure 11A:
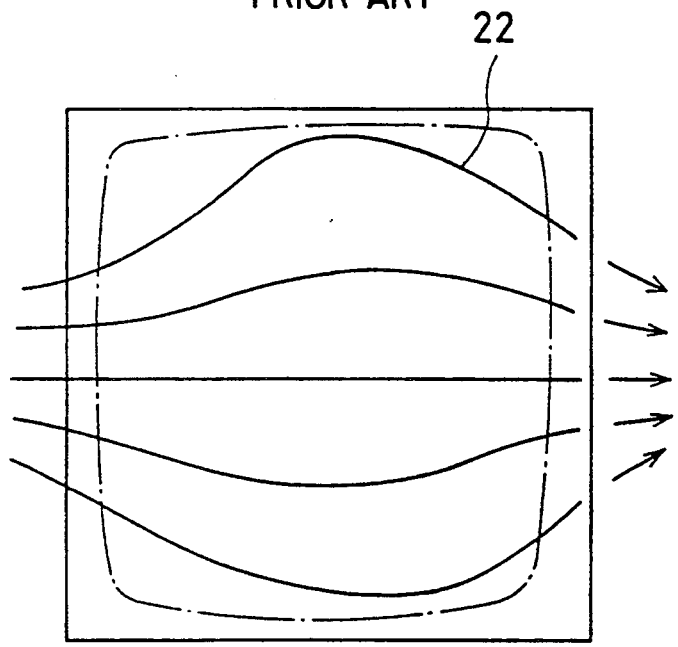
FIG. 11 ($a$) and ($b$) are schematic diagrams respectively showing a magnetic flux distribution and the rotational motion of electrons in a conventional magnetron etching apparatus.
Figure 11B:
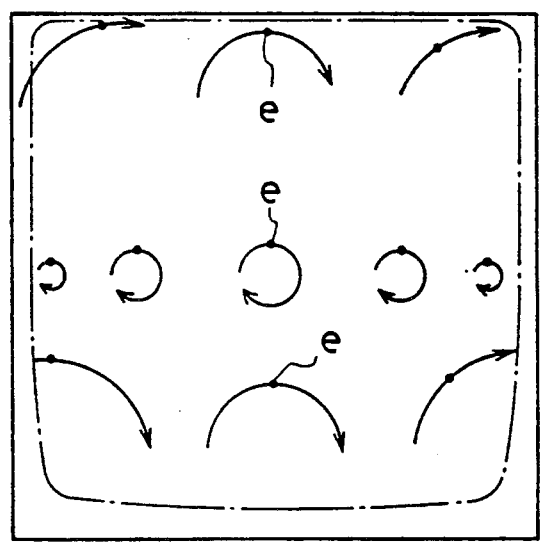

With a magnetron etching apparatus using a conventional rotational magnetic field, the distribution of magnetic flux 22 immediately above the sample stage 2 at a certain moment is nonuniform as shown in FIG. 11 (a) . Each of electrons e (represented by black points in FIG. 11 (b)) in the chamber 1 is rotated with an orbital radius which is in inverse proportion to the intensity of the magnetic field. Accordingly, at the upper and lower part s of the chamber 1 and the outer peripheral part of the plasma generating zone where the intensity of the magnetic field is weak, each electron e is increased in orbital radius , so that the electron e comes in collision with the wall of the chamber 1, causing the electron e to disappear.

Consideration is now given to the X direction which traverses the center part of the plasma generating part 21 from the left side to the right side. At the center part where the intensity of the magnetic field is weak, the electrons e are decreased in density to decrease the plasma in density. At the outer peripheral part where the intensity of the magnetic field is strong, the electrons e are increased in density to increase the plasma in density. In such a conventional dry etching apparatus, the entire plasma density is thus nonuniform. This causes a workpiece to be unevenly etched or damaged.

Figure 12:
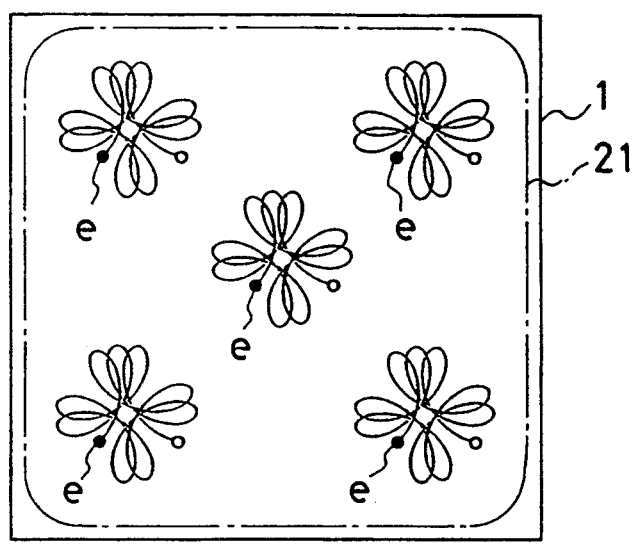
FIG. 12 is a schematic diagram showing the spatial distribution of cycloid motions of electrons in the dry etching apparatus in FIG. 1.

On the other hand, in the dry etching apparatus to which the plasma generating method of the present invention is applied, the electric field and the magnetic field in the plasma generating part 21 surrounded by the lateral electrodes 5, 6, 7, 8 are substantially uniform. Accordingly, as shown in FIG. 12, the configurations of the loci of cycloid motion combined with rotational motion of electrons e are substantially equal to one another at different places. Accordingly, the plasma density is substantially uniform in the plasma generating part 21 in its entirety. In this dry etching apparatus, both ions and radicals produced from etching reactive gas in the plasma generating part 21 is irradiated substantially uniformly on the entire surface of the sample to be etched 3. Accordingly, etching can be uniformly conducted on the entire area of the sample to be etched 3 exposed to the plasma generating part 21, damages to the sample due to charge-up are considerably reduced and the plasma density is high, thereby increasing the etching rate.

Figure 13A:
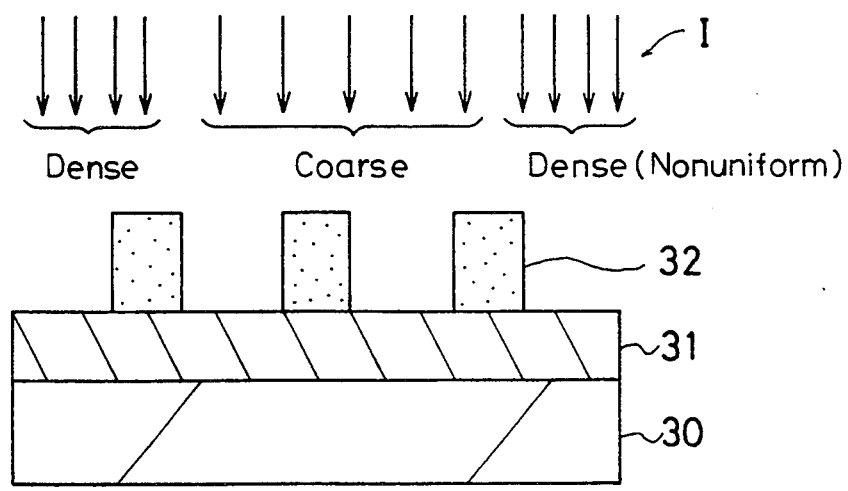
FIG. 13 ($a$) to ($c$) are views illustrating how boron phosphorus glass is etched with the use of a conventional magnet ton etching apparatus, wherein ($a$) is a section view of the glass under etching, ($b$) is a view illustrating the distribution of the intensities of a magnetic field, and ($c$) is a view illustrating the etching speed.
Figure 13B:
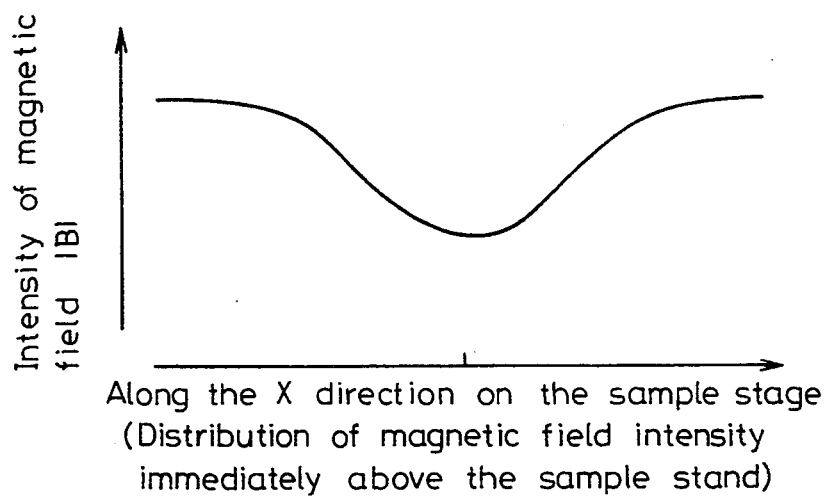
Figure 13C:
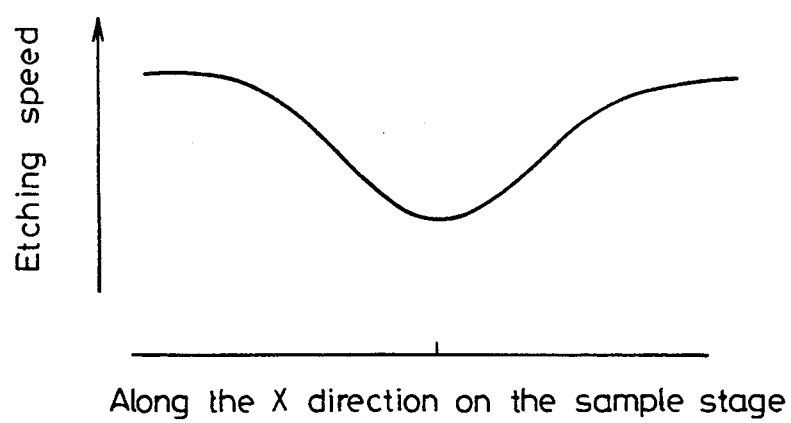

FIG. 13 (a) schematically shows an example of etching boron phosphorus glass with a magnetron etching apparatus using a conventional rotational magnetic field. In FIG. 13 (a), there is shown a Si substrate 30, boron phosphorus glass 31 and a photo-resist pattern 32. When the distribution of the intensities of a magnetic field at a certain moment immediately above the Si substrate 30 or sample stage is minimized at the center of the sample stage as shown in FIG. 13 (b), an ion flux I incident upon the surface of the Si substrate 30 is proportional to the plasma density distribution corresponding to the magnetic field intensity distribution and is therefore coarse at the center as shown in FIG. 13 (a). As shown in FIG. 13 (c), the speed of etching an oxide layer (boron phosphorus glass 31) substantially follows the ion flux I and is therefore nonuniform. Further, the nonuniformity of the plasma density causes the boron phosphorus glass to be damaged due to uneven distribution of electric charges.

Figure 14A:
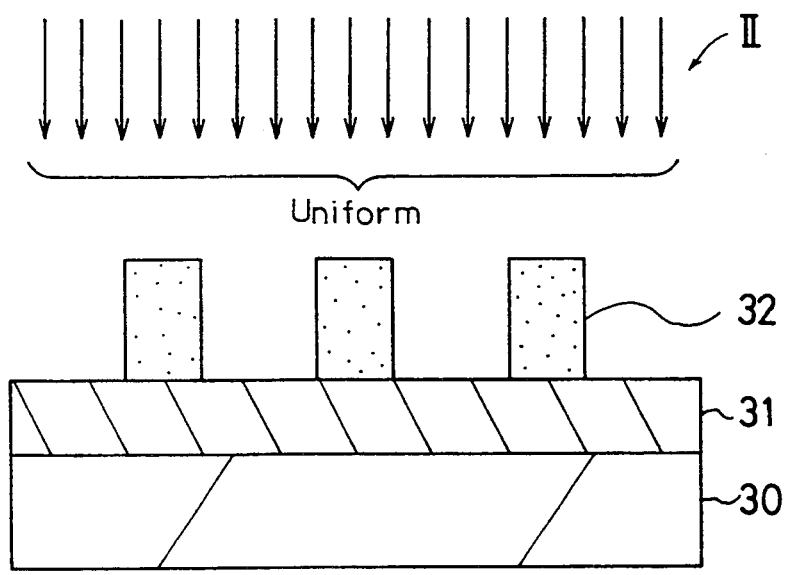
FIG. 14 ($a$) and ($b$) are views illustrating how boron phosphorus glass is etched with the use of the dry etching apparatus shown in FIG. 1, wherein ($a$) is a section view of the glass under etching, and ($b$) is a view illustrating the etching speed.
Figure 14B:
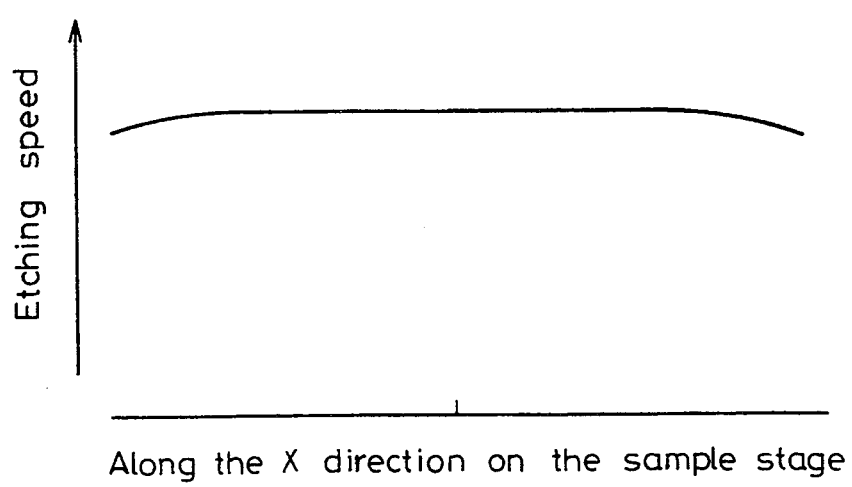

FIG. 14 (a) schematically shows an example of etching boron phosphorus glass with a dry etching apparatus to which the plasma generating method of the present invention is applied. With this dry etching apparatus, a substantially uniform plasma is generated as mentioned earlier. Accordingly, an ion flux II which is an etching reactive particle incident upon the surface of the Si substrate 30, is uniform as shown in FIG. 14 (a). Further, the etching speed is also highly uniform as shown in FIG. 14 (b). Further, since the plasma is uniform, electric charges are hardly unevenly distributed so that damages to the glass due to the charges are considerably small. In this example, as the gas to be introduced into the chamber 1, there was used gas made based on flon gas such as $CHF_3+O_2$, $CF_4+CH_2F_2$ or the like, and the gas pressure was set to 0.1 to 10 Pa. The etching rate was in the range from 100 to 350 nm/min.

Such a dry etching apparatus may be suitably used particularly for etching a sub-micron pattern or a great-diameter semiconductor wafer of 6", 8" or the like. More specifically, since the pressure in the chamber 1 is low, ion scattering is reduced. This lowers the dependency, on the pattern size, of the etching rate or the dimensional shift (so-called CD loss) which is calculated by subtracting the line width of the sample after etched, from the line width of the photoresist pattern. Further, since the uniformity of the plasma is high, the chamber 1 can be readily increased in size.

Preferably, the dry etching apparatus uses a chamber system made of a nonmagnetic material in order to prevent the magnetic field applied from being distorted in spatial distribution, or uses a magnetically shielded chamber system in order to prevent the magnetic field from being externally influenced.

With the use of this dry etching apparatus, there was conducted another test using gas mixingly containing $SF_6$ and a trace amount of oxygen as the etching gas, and polycrystal Si doped with phosphorus as a sample to be etched. From the test results, it was found that the present invention produced a great effect when there was used, as the etching gas, electronegative gas such as $SF_6$, oxygen, chlorine, iodine or the like. This would be explained in the following manner. In a high frequency plasma of electronegative gas, the electron density is low and the resistance is high so that the potential gradient in the plasma is greater as compared with the case using electropositive gas. In this case, too, the electric field inside of the parallel plate electrodes was uniform, so that a plasma excellent in uniformity was obtained and the uniformity of etching was also excellent. Since the plasma was hardly unevenly distributed, there were hardly observed damages to devices such as breakdown of MOSLSI gate oxide layers or the like. The etching rate was in the range from 200 to 400 nm/min.

In the example above-mentioned, an oxide layer and polycrystal Si were etched. However, satisfactory effects can also be produced when the dry etching apparatus above-mentioned is used for etching a Si compound, metal such as Al or the like, or a multilayer resist. In such a case, the use of electronegative gas such as chlorine, $SF_6$, $O_2$ or the like would produce greater effects.

In FIG. 15, the dry etching method of this embodiment is compared with conventional dry etching methods. From FIG. 15, it can be understood that the dry etching method of the embodiment is superior to the conventional methods.

As discussed in the foregoing, according to the present embodiment, high frequency electric powers of the same frequency are applied to the four lateral electrodes 5, 6, 7, 8 surrounding the plasma generating zone, and adjustment is made such that the respective phases of the electric powers applied to the lateral electrodes 5, 6, 7, 8 are successively advanced or delayed by 90° in order of the reference numerals, thereby to form a rotational electric field in the plasma generating zone. Further, a direct electric current is let flow in the opposite upper and lower circular coils 101, 102 in the same direction, thereby to apply a magnetic field to the surface of the sample to be etched 3 substantially at a right angle thereto. This converts a translational motion produced by the rotational electric field into a motion which revolves in the plasma generating part. This causes the major portion of electrons in the plasma generating part to present a revolving motion as confined in the chamber 1, so that a highly dense plasma excellent in uniformity can be generated under a high vacuum.

In the present embodiment, high frequency electric power of 13.56 MHz is applied between the sample stage 2 and the opposite electrode 4 and such application can be controlled. Accordingly, the etching selectivity between etched material and underlying material at the time of etching can also be controlled. Further, since the plasma is hardly unevenly distributed, damages to a workpiece can be considerably reduced.

In the present embodiment, the frequency f of the high frequency electric powers applied to the lateral electrodes 5, 6, 7, 8 is equal to 10 MHz during the generation of a plasma, and an electric current is applied to the upper and lower circular coils 101, 102 such that the intensity B of the magnetic field formed by the upper and lower circular coils 101, 102 is greater than 5 G and smaller than 10 G or greater than −20 G and smaller than −10 G. However, the frequency of the high frequency electric powers and the intensity of the magnetic field are not necessarily limited to the respective values above-mentioned. The effects produced by the present invention would be satisfactory when the frequency f of the high frequency electric powers applied to the lateral electrodes 5, 6, 7, 8 is greater than 1 MHz during the generation of a plasma and when the intensity B of the magnetic field formed by the upper and lower circular coils 101, 102 is greater than 2 G or smaller than −2 G.

In order to minimize the deviation of the orbits of the electrons e from the plasma generating zone when one side or the diameter of the plasma generating zone is made equal to 30 cm for etching a 6″ or 8″ wafer, it is preferable to establish the relationship represented by the following equation among the intensity E (V/cm) of the electric field, the frequency f (MHz) of the high frequency electric powers and the intensity B (G) of the magnetic field formed by a pair of circular coils:

$$1(V/cm)/(G \times MHz) < E/|B \times f| < 50(V/cm)/(G \times MHz)$$

In the present embodiment, the description has been made of the case where a steady magnetic field is applied. However, it is also effective that a high frequency magnetic field is applied to cause the trajectory of the electrons e to be random in the plasma generating zone so that the plasma is made uniform.

Figure 16:
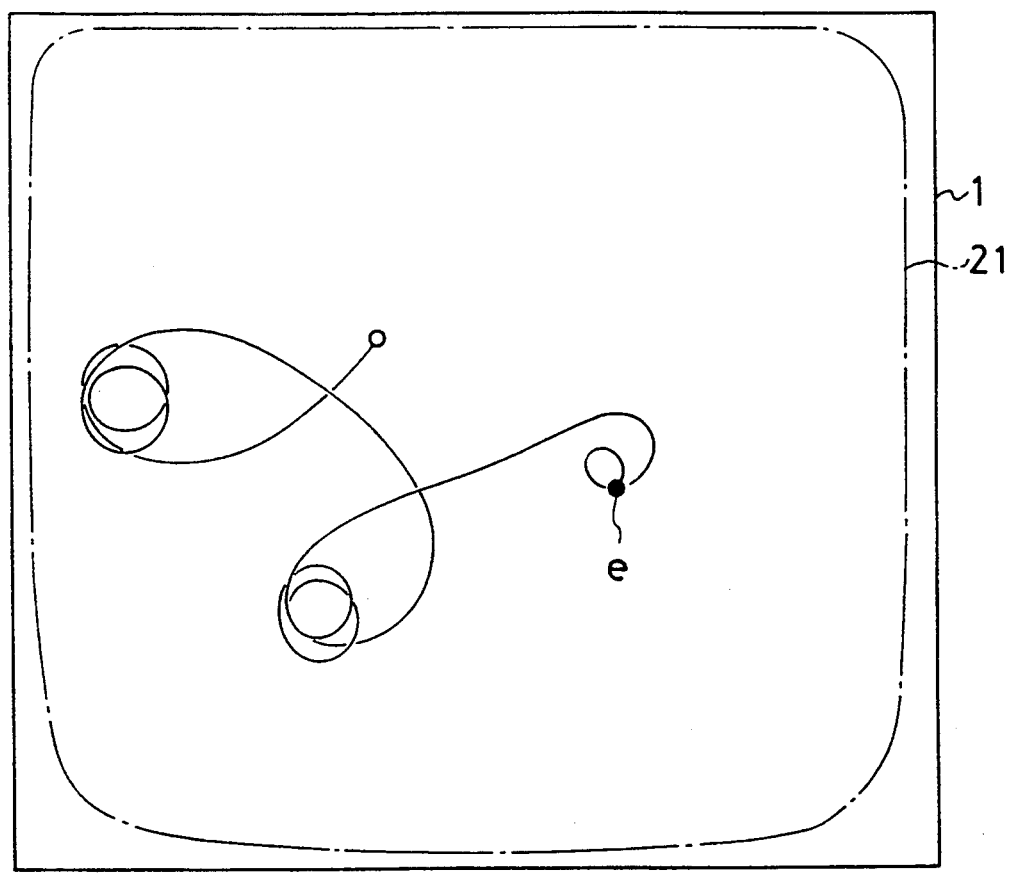
FIG. 16 is a schematic diagram showing the cycloid motion of an electron at the time when a high frequency magnetic field is applied in the dry etching apparatus in FIG. 1.
Figure 17:
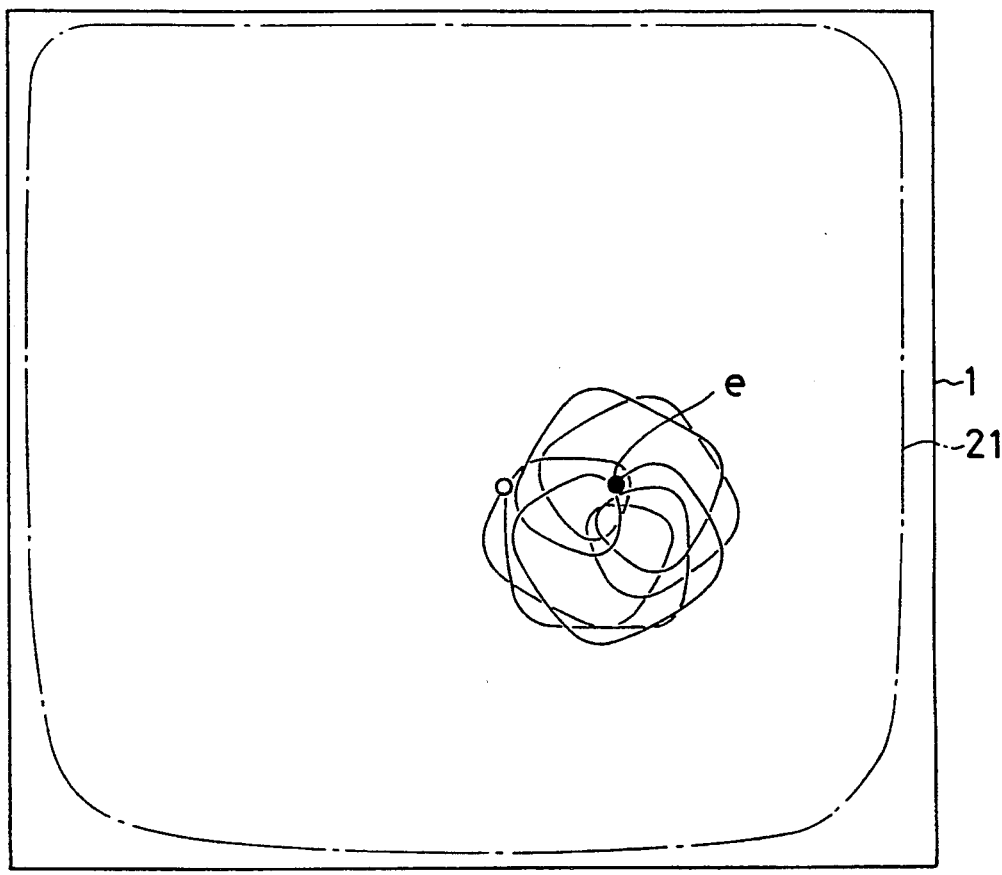
FIG. 17 is a schematic diagram showing the cycloid motion of an electron at the time when a high frequency magnetic field is applied in the dry etching apparatus in FIG. 1.

FIG. 16 shows an example where high frequency electric powers are applied to the circular coils 101, 102 in order to form a high frequency magnetic field B $(G) = 10 + 10 \cos(w_E t)$, and FIG. 17 shows an example where high frequency electric powers are applied to the circular coils 101, 102 in order to form a high frequency magnetic field B $(G) = -10 + 10 \cos(w_E t)$. Here, $w_E$ is equal to $2\pi f$, f is equal to 10 MHz and t refers to time.

The present embodiment is arranged such that the difference in phase between the high frequency electric powers applied to adjacent electrodes is set to 90°. This is because the number of electrodes surrounding the plasma generating zone is four. Accordingly, when the plasma generating zone is surrounded by n electrodes, the difference in phase between the high frequency electric powers applied to adjacent electrodes may be set to (360/n)°. As the number of electrodes is increased, the distribution of the electric field in the plasma generating zone is preferably further uniformalized.

As means of applying a magnetic field to the sample to be etched 3 substantially at a right angle thereto, the present embodiment uses a method by which a direct current is let flow in the upper and lower circular coils 101, 102 in the same direction. This is because this method enables the magnetic field to be readily controlled in intensity and direction, thereby to uniformalize the plasma by a simple mechanism. Instead of the pair of circular coils 101, 102, electromagnets or permanent magnets may be used to apply a predetermined magnetic field.

Figure 18:
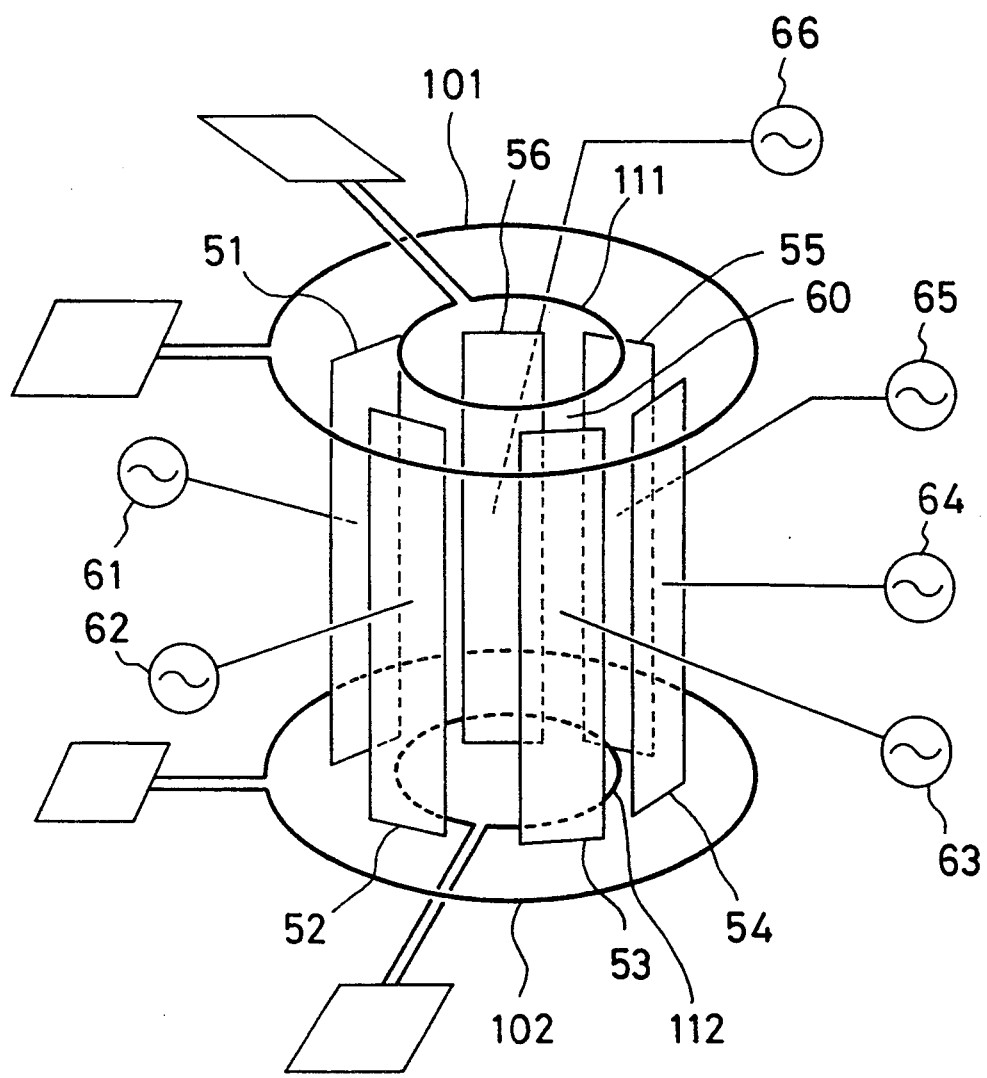
FIG. 18 is a schematic diagram showing the structure of a dry etching apparatus to which applied is the plasma generating method according to a second embodiment of the present invention.

With reference to FIG. 18, the following description will discuss a dry etching apparatus to which applied is the plasma generating method according to a second embodiment of the present invention.

In FIG. 18, six lateral electrodes 51, 52, 53, 54, 55, 56 are disposed to surround a plasma generating zone 60. High frequency electric powers of the same frequency or 20 MHz are applied to the lateral electrodes 51 to 56 by high frequency power supplies 61, 62, 63, 64, 65, 66, respectively. Provision is made such that the respective phases of the high frequency electric powers respectively applied to the lateral electrodes 51 to 56 are successively advanced or delayed by 60° in order of the reference numerals. In FIG. 18, an electric current is applied to upper and lower circular coils 101, 102 in the same direction likewise in the first embodiment. There is disposed an upper small-diameter circular coil 111 which is concentric with the upper circular coil 101 and of which diameter is smaller than that thereof. There is also disposed a lower small-diameter circular coil 112 which is concentric with the lower circular coil 102 and of which diameter is smaller khan that thereof. Applied to the upper and lower small-diameter circular coils 111, 112 is a current of which direction is reverse to that of the current applied to the upper and lower circular coils 101, 102 and which is smaller than that applied to the upper and lower circular coils 101, 102. The pressure in the chamber 1 is controlled to about 0.1 to about 10 Pa by a turbo pump (not shown).

The second embodiment differs from the first embodiment in the following two points. In the second embodiment, the number of the lateral electrodes is six so that the difference in phase among the high frequency electric powers applied to adjacent lateral electrodes is 60°. In addition to the upper and lower circular coils 101, 102, there are disposed the upper and lower small-diameter circular coils 111, 112 which are respectively concentric with the upper and lower circular coils 101, 102, of which diameters are smaller than those thereof, and to which a weak direct current is applied in the reverse direction. Accordingly, the intensity of the magnetic field is slightly stronger at the peripheral part of the plasma generating zone 60 than at the center thereof.

The increased number of lateral electrodes in the first point improves the spatial uniformity of the electric field in the plasma generating zone 60. The use of two different pairs of circular coils in the second point reduces the range of the loci of cycloid motion of the electrons at the peripheral part of the plasma generating zone 60. This further reduces the loss of the electrons from the plasma generating zone 60. Accordingly, the plasma is further improved in uniformity in the second embodiment than in the first embodiment.

The dry etching apparatus according to the second embodiment was applied to aluminium etching. When there was used gas made based on chlorine such as $BCl_3 + Cl_2$, $SiuCl_4 + Cl_2 + CHCl_3$ or the like, and the pressure was set to 0.1 to 20 Pa, there was obtained an etching rate of 400 to 900 nm/min.

As discussed in the foregoing, the second embodiment has a mechanism for applying high frequency electric powers of the same frequency to the six lateral electrodes such that the difference in phase between adjacent lateral electrodes is 60°, and a mechanism including two different pairs of circular coils. Accordingly, there can be obtained a plasma further excellent in uniformity to further improve the uniformity of etching. Further, the plasma is hardly unevenly distributed.

This greatly reduces damages to devices such as breakdown of gate oxide layers or the like.

In order that the intensity of the magnetic field is slightly stronger at the periphery of the plasma generating zone 60 than at the center thereof, the second embodiment uses two different pairs of circular coils. However, there may be combined a plurality of types of coils having optional configurations which are not concentric with one another and which are not located in the same plane, or circular coils may be combined with electromagnets or permanent magnets.

Figure 19:
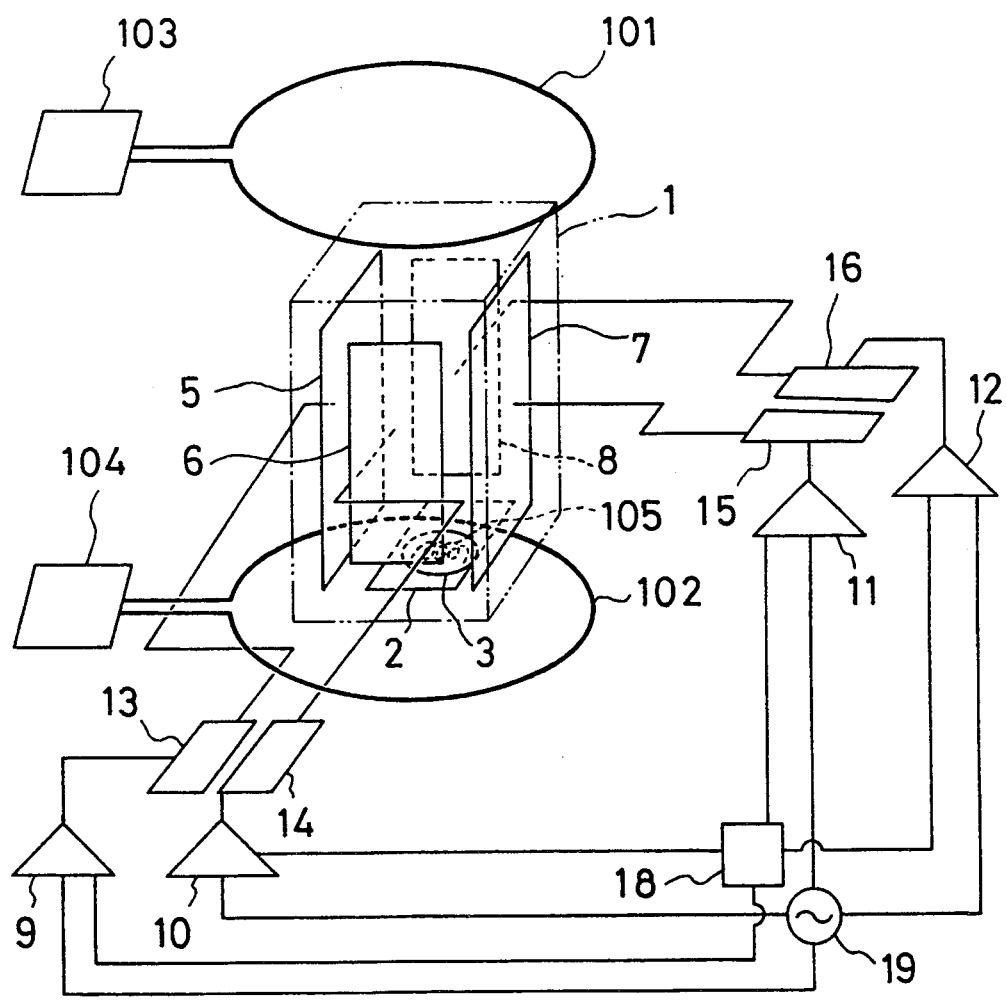
FIG. 19 is a schematic diagram showing the structure of a CVD apparatus to which applied is the plasma generating method according to a third embodiment of the present invention.

With reference to FIG. 19, the following description will discuss a CVD apparatus to which applied is the plasma generating method according to a third embodiment of the present invention.

The CVD apparatus to which the third embodiment is applied, differs in the following two points from the dry etching apparatus in FIG. 1 to which the first embodiment is applied. That is, the CVD apparatus in FIG. 19 does not have means for supplying high frequency electric power to the sample stage 2 such as the high frequency power supply, the amplifier 20, the matching circuit 17 and the opposite electrode 4 shown in FIG. 1, and the CVD apparatus in FIG. 19 is provided on the sample stage 2 with a heater 105 for controlling the thickness of a deposit film. Other arrangements than the two points above-mentioned are the same as those of the dry etching apparatus shown in FIG. 1. Accordingly, like parts are designated by like reference numerals used in FIG. 1 with a detailed description thereof here omitted.

In the CVD apparatus, 15 sccm of $N_2$ gas and 15 sccm of $SiH_4$ gas are introduced into the chamber 1. Preferably, the pressures of these gases are set to 0.07 Pa and the temperature of the sample stage 2 is set to 400° C.

Figure 20:
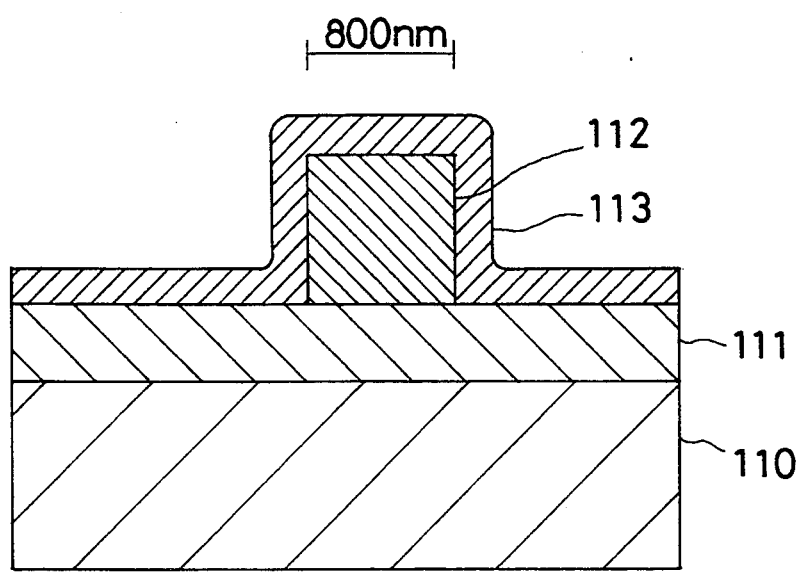
FIG. 20 is a section view of a semiconductor chip prepared by the CVD apparatus in FIG. 19.
Figure 21:
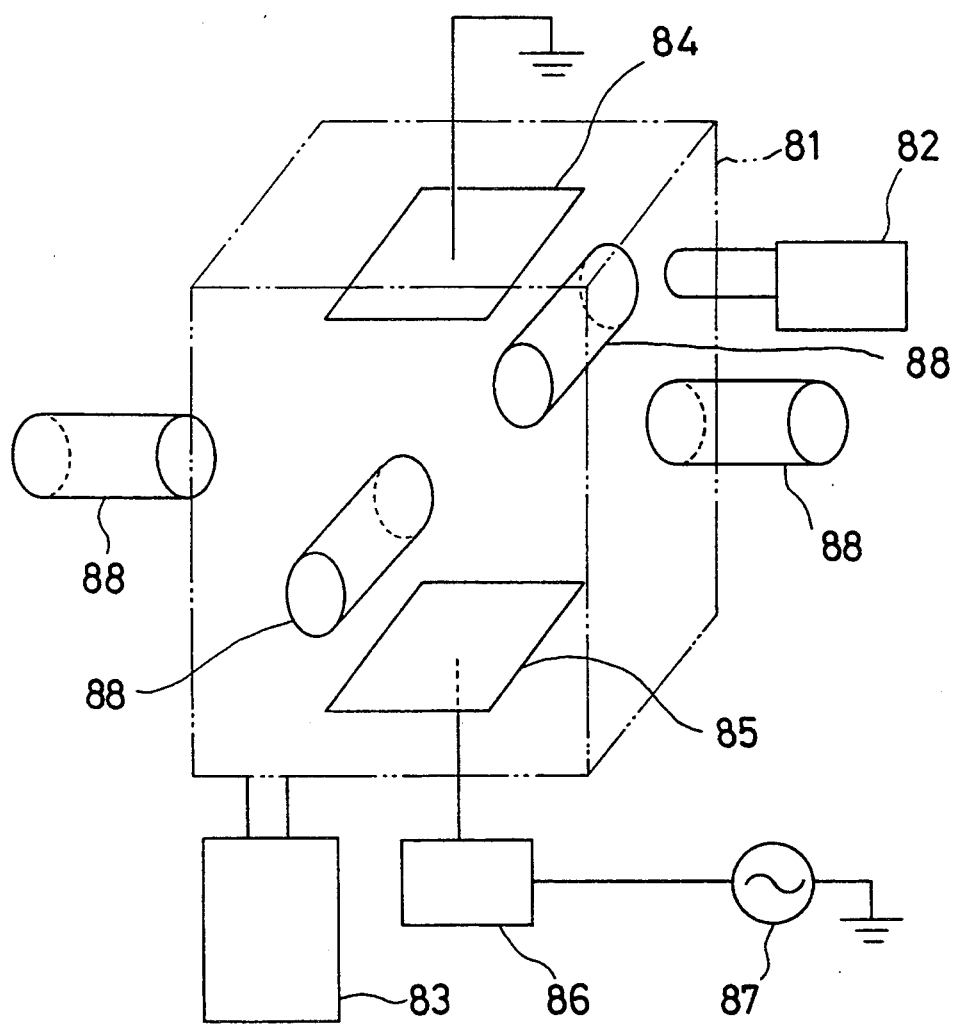
FIG. 21 is a schematic diagram of a reactive ion etching apparatus using conventional magnetron discharge.

FIG. 20 shows a section of a semiconductor chip prepared by the CVD apparatus. A thermal oxide layer 111 is formed on a Si substrate 110. Aluminium 112 deposited in a thickness of 0.8 $\mu$m by sputtering, is made in the form of a wire having a width of 0.8 $\mu$m by photolithography and dry etching. On the aluminium 112, a SiN layer 113 is deposited by the CVD apparatus.

This CVD apparatus is suitably used in a CVD method for a 6" or 8" large-diameter semiconductor wafer. That is, as discussed in connection with the dry etching apparatus, the CVD apparatus can enhance the spatial uniformity of a plasma so that a deposit layer can be uniformly formed on the wafer in its entirety.

What is claimed is:

1. A plasma generating method comprising:
   a first step of disposing three of more lateral electrodes at lateral sides of a plasma generating part in a vacuum chamber;
   a second step of respectively applying, to said lateral electrodes, high frequency electric powers of which frequencies are the same as one another and of which phases are different from one another, thereby to excite, in said plasma generating part, a high frequency rotating electric field to cause electrons under translational motions in said plasma generating part to present rotating motions with translational movement component; and
   a third step of applying, to said plasma generating part, a magnetic field substantially at a right angle to the working plane of said high frequency rotating electric field, thereby to convert said translational movement of said electrons under rotating motions in said plasma generating part into revolving movement by which said electrons revolve in said plasma generating part;
   said electrons in said plasma generating part being confined therein.

2. A plasma generating method according to claim 1, wherein
   the third step comprises a step of applying, to said plasma generating part, a magnetic field substantially at a right angle to the working plane of said high frequency rotating electric field, thereby to convert said translational movement of said electrons under rotating motions in said plasma generating part into revolving movement by which said electrons revolve in said plasma generating part in a direction identical with or reverse to the direction of said rotational motions.

3. A plasma generating method according to claim 1, wherein the magnetic field at the third step is steady with the passage of time.

4. A plasma generating method according to claim 1, wherein the magnetic field at the third step is unsteady with the passage of time.

5. A plasma generating method according to claim 1, wherein the high frequency electric powers at the second step are greater than 1 MHz, and the absolute value of the intensity of the magnetic field at the third step is greater than 2 G.

6. A plasma generating method according to claim 1, wherein the following relationship is established among the frequency f (MHz) of the high frequency electric powers at the second step, the intensity E (V/cm) of the rotational electric field excited by said high frequency electric powers and the absolute value B (G) of the intensity of the magnetic field at the third step:

$$1 < E/Bf < 50$$

7. A plasma generating method according to claim 1, wherein the intensity of the magnetic field at the third step is greater at the periphery of the plasma generating part than at the center thereof.

8. A plasma generating method according to claim 1, wherein the wall of the vacuum chamber is made of a nonmagnetic material.

9. A plasma generating method according to claim 1, wherein the wall of the vacuum chamber is magnetically shielded.

10. A plasma generating apparatus comprising:
   three or more lateral electrodes disposed at lateral sides of a plasma generating part in a vacuum chamber;
   high frequency electric power applying means for applying, to said lateral electrodes, respective high frequency electric powers of which frequencies are the same as one another and of which phases are different from one another, thereby to excite, in said plasma generating part, a high frequency rotating electric field to cause electrons under translational motions in said plasma generating part to present rotating motions; and
   magnetic field applying means for applying a magnetic field substantially at a right angle to the working plane of said high frequency rotating electric field, thereby to convert said translational movement of said electrons under rotating motions in said plasma generating part into revolving movement by which said electrons revolve in said plasma generating part such that said electrons in said plasma generating part are confined therein.

11. A plasma generating apparatus according to claim 10, further comprising:
a sample stage disposed at a lower part of the plasma generating part inside of the vacuum chamber; and
an opposite electrode disposed at an upper part of said plasma generating part inside of said vacuum chamber.

12. A plasma generating apparatus according to claim 11, wherein a bias voltage is applied to the sample stage for irradiating a plasma to a sample to be placed on said sample stage.

13. A plasma generating apparatus according to claim 11, further comprising temperature control means for controlling the temperature of the sample stage such that a plasma is irradiated to a sample to be placed on said sample stage.

14. A plasma generating apparatus according to claim 10, wherein the magnetic field applying means has a pair of upper and lower coils so disposed as to be vertically opposite to each other, and power supplies for respectively applying electric currents to said pair of coils.

15. A plasma generating apparatus according to claim 14, wherein the power supplies have means for applying, to the pair of coils, electric currents which are steady with the passage of time.

16. A plasma generating apparatus according to claim 14, wherein the power supplies have means for applying, to the pair of coils, electric currents which are unsteady with the passage of time.

17. A plasma generating apparatus according to claim 10, wherein the three or more lateral electrodes and the magnetic field applying means are disposed outside of the vacuum chamber.

18. A plasma generating apparatus according to claim 10, wherein members made of quartz or ceramics are disposed between the plasma generating part and each of the lateral electrodes, and between said plasma generating part and the magnetic field applying means.

19. A plasma generating apparatus according to claim 10, wherein the high frequency electric power applying means has phase locking means arranged such that the differences in phase among the high frequency electric powers respectively applied to the lateral electrodes are the same as each other.

20. A plasma generating apparatus according to claim 10, wherein the high frequency electric power applying means has means for respectively applying, to the lateral electrodes, three or more high frequency electric powers which are supplied from the same power supply and of which phases are different from one another.

21. A plasma generating apparatus according to claim 10, wherein the wall of the vacuum chamber is made of a nonmagnetic material.

22. A plasma generating apparatus according to claim 10, wherein the wall of the vacuum chamber is magnetically shielded.

* * * * *